United States Patent [19]

Lindner

[11] Patent Number: 4,726,319

[45] Date of Patent: Feb. 23, 1988

[54] APPARATUS AND METHOD FOR COATING OPTICAL FIBERS

[75] Inventor: Georg H. Lindner, Vlissingen, Netherlands

[73] Assignee: M&T Chemicals Inc, Woodbridge, N.J.

[21] Appl. No.: 793,073

[22] Filed: Oct. 31, 1985

[51] Int. Cl.$^4$ ............................................. C23C 16/54
[52] U.S. Cl. ................................... 118/718; 118/725; 118/726; 427/163
[58] Field of Search .................... 118/718, 725, 726; 427/163

[56] References Cited

U.S. PATENT DOCUMENTS 2,893,895  7/1959  Claussen .............................. 118/718
2,958,899  11/1960  Stein .................................... 118/718
3,622,369  11/1971  Basche ................................. 118/718

Primary Examiner—Richard Bueker
Attorney, Agent, or Firm—S. H. Parker; R. E. Bright

[57] ABSTRACT

Apparatus for coating an optical fiber with a metal oxide coating material in vapor form, includes a coating chamber through which the fiber moves, the coating chamber including an inlet supplied with the coating material in vapor form, a circumferential passage for supplying the coating material to the fiber, a flow restriction passage in fluid communication between the inlet and the circumferential passage for supplying the coating material from the inlet to the circumferential passage, the flow restriction passage including a tortuous circumferential path through a plurality of circumferentially arranged orifices and a through a narrow gap, and an oil jacket containing heated oil surrounding the walls of the coating chamber for heating the same; an evaporator for supplying the coating material in vapor form to the inlet; and a heating assembly for supplying heated air to the evaporator to entrain the coating material and for supplying heated oil to the evaporator for heating the coating material and to the oil jacket of the coating chamber.

28 Claims, 3 Drawing Figures

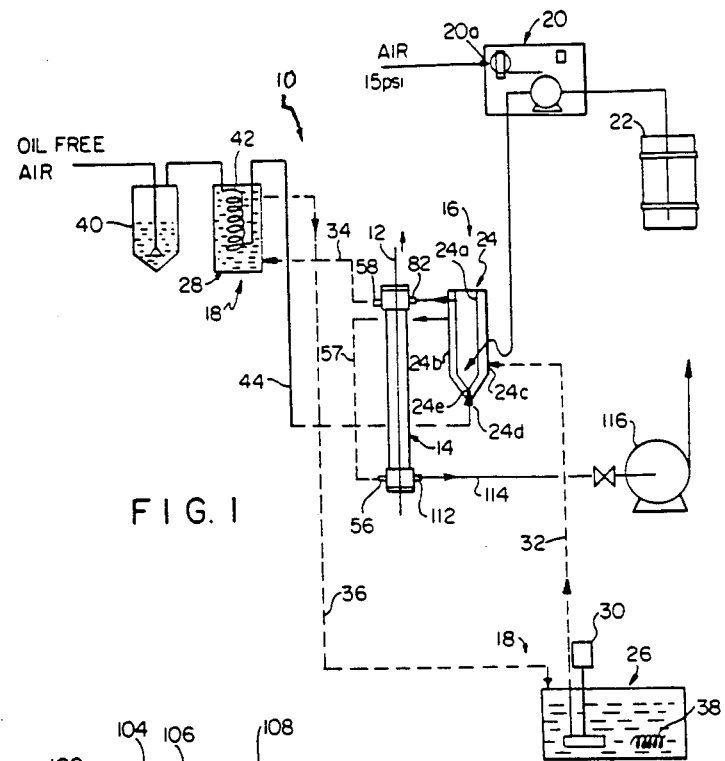
FIG. 1
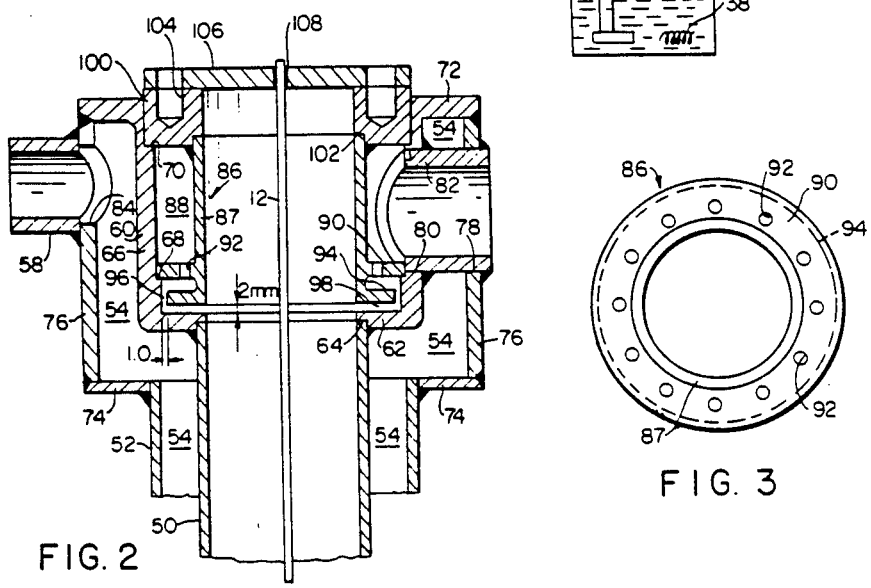
FIG. 2
FIG. 3

APPARATUS AND METHOD FOR COATING OPTICAL FIBERS

BACKGROUND OF THE INVENTION

This invention relates generally to coating apparatus and, more particularly, to apparatus for coating optical fibers.

It is known to coat an optical fiber by passing the optical fiber through a coating chamber in which a coating material, such as a metal oxide, for example, tin oxide, impinges on the fiber. Specifically, the optical fiber travels in the lengthwise direction thereof through the coating chamber, while at least one spray jet coats the optical fiber with the coating material while the latter is in vapor form.

With such arrangement, however, there is a tendency for the vapor stream to produce a non-uniform coating on the optical fiber. This is particularly so at low flow rates, and in view of rapid cooling of the optical fiber. It has therefore been necessary to use higher flow rates of the vapor stream. This, however, results in disturbance of the optical fiber. Specifically, the higher flow rates result in turbulence, causing a disturbance of the optical fiber with a resultant non-uniform coating. The turbulence also may result in the undesirable introduction of air into the chamber, and the production of a swirling current or eddy currents, which also produce a non-uniform coating.

OBJECTS AND SUMMARY OF THE INVENTION

Accordingly, it is an object of the present invention to provide an apparatus and method for coating optical fibers in which the coating material in vapor form is uniformly distributed about the optical fiber.

It is another object of the present invention to provide an apparatus and method for coating optical fibers which achieves a uniform coating at low flow rates of the coating material.

It is still another object of the present invention to provide an apparatus and method for coating optical fibers that achieves a high concentration of coating material at low flow rates.

It is yet another object of the present invention to provide an apparatus and method for coating optical fibers that prevents turbulence in the vapor stream of the coating material.

It is a further object of the present invention to provide an apparatus and method for coating optical fibers that eliminates the need for high flow rates in the vapor stream of the coating material.

It is a still further object of the present invention to provide an apparatus and method for coating optical fibers that minimizes the amount of air drawn into the coating chamber.

It is a yet further object of the present invention to provide an apparatus and method for coating optical fibers that prevents condensation of the coating material on the inner walls of the coating chamber.

It is another object of the present invention to provide an apparatus and method for coating optical fibers that minimizes cooling of the optical fibers during the coating operation.

In accordance with an aspect of the present invention, a coating chamber for coating an elongated fiber with a coating material in vapor form as the fiber moves therethrough, includes an inlet supplied with the coating material in vapor form; circumferential passage means for supplying the coating material to the fiber; and flow restriction means is fluid communication between the inlet and the passage means for restricting flow of the coating material from the inlet to the passage means.

In accordance with another aspect of the present invention, a method of coating an elongated fiber with a coating material in vapor form, includes the steps of moving the fiber through a coating chamber; supplying the coating material in vapor form to an inlet of the coating chamber; controlling the flow of the coating material from the inlet through flow restriction means of the coating chamber to restrict the flow thereof; and supplying the coating material from the flow restriction means through passage means of the coating chamber so that the coating material in vapor form impinges on the fiber.

The above, and other, objects, features and advantages of the present invention will become readily apparent from the following description of the invention, which is to be read in connection with the accompanying drawings.

BRIEF DESCRIPTION OF THE DRAWINGS

FIG. 1 is a schematic representation of apparatus for coating optical fibers according to the present invention;

FIG. 2 is a longitudinal cross-sectional view of the upper portion of the coating chamber in the apparatus of FIG. 1; and FIG. 3 is a top plan view of the flow controlling member of the coating chamber of FIG. 2.

DETAILED DESCRIPTION OF A PREFERRED EMBODIMENT

Referring to the drawings in detail, and initially to FIG. 1 thereof, apparatus 10 for coating optical fibers 12 according to the present invention, generally includes a coating chamber 14 for coating an optical fiber 12 as the latter travels therethrough, a coating material supply assembly 16 which supplies the coating material in vapor form to coating chamber 14, and a heating assembly 18 for heating the coating material to change it to vapor form and for heating coating chamber 14.

Specifically, coating material supply assembly 16 includes a metering pump 20 which supplies a chemical composition as the coating material from a source 22 of the coating material to coating chamber 14, for example, at the rate of 0.2 pounds/hour. Metering pump 20 may be a conventional metering pump, and may also include an air inlet 20a supplied with air under pressure, for example, at 15 psi, for use in the pumping operation. The coating material from metering pump 20 is supplied at an angle through the side wall of an evaporator 24 to an inner chamber 24a thereof, evaporator 24 also forming part of coating material supply assembly 16.

Evaporator 24 functions to vaporize the coating material, and then supply the coating material in vapor form to coating chamber 14. Specifically, evaporator 24 includes an outer jacket 24b having a diameter in the range of 20–24 mm and a length of approximately 300 mm, jacket 24b having a conical bottom. A first inlet 24c in outer jacket 24b is supplied with heated oil from a heated oil bath 26, and second and third inlets 24d and 24e in the conical bottom of outer jacket 24b and inner chamber 24a, respectively, supply heated air from an air heater 28 into inner chamber 24a for mixture with the coating material. Thus, there results a spray of finely divided particles of the coating material entrained in the air stream supplied through inlets 24d and 24e. Heated oil bath 26 and air heater 28 both form part of heating assembly 18.

As shown, a pump 30 in heated oil bath 26 pumps the heated oil through an oil line 32 to first inlet 24c of outer jacket 24b of evaporator 24. The heated oil from outer jacket 24b then passes through coating chamber 14, as will be described later, and then to an oil line 34 which supplies the heated oil to air heater 28, the latter of which functions as a heat exchanger. The heated oil then travels from air heater 28 back to heated oil bath 26 through an oil line 36, the oil being reheated in heated oil bath 26 by means of a heating device 38. In this manner, the oil flows through a closed path and is heated upon its return to heated oil bath 26.

With regard to the heated air, oil free air is supplied under pressure, for example, at 15 psi at the rate of 15 moles/hour, to a water bubbler 40, which also forms part of heating assembly 18. Water bubbler 40 functions as a humidifier to the incoming air. Generally, air is bubbled through water therein which is maintained at approximately 20 degrees Centrigrade. Thereafter, the humidified air is supplied to air heater 28, and particularly, to a copper coil 42 thereof which is immersed in the oil supplied to air heater 28. The air is therefore heated in the range of 170–190 degrees Centrigrade, and then supplied through an air line 44 to second and third inlets 24*d* and 24*e* of outer jacket 24*b*.

Referring now to FIG. 2, the upper portion of coating chamber 14 is shown to include an inner chamber pipe 50 through which optical fiber 12 travels. The diameter of chamber pipe 50 is preferably in the range of 34–38 mm and it may have a length of approximately 0.6 meters. A heating jacket surrounds chamber pipe 50 for heating the same, and may include electrical means. Preferably, as shown, an oil jacket 52 surrounds chamber pipe 50 and preferably has a diameter in the range of 56–60 mm. In this manner, an oil chamber 54 is formed between chamber pipe 50 and oil jacket 52, through which the heated oil supplied from outer jacket 24*b* of evaporator 24 flows. Oil jacket 52 is formed with an oil inlet 56 at the lower portion of coating chamber 14, as shown in FIG. 1, to which oil is supplied from evaporator 24 through an oil line 57. An oil outlet pipe 58, shown in FIGS. 1 and 2, is provided at the upper portion of coating chamber 14, which supplies the heated oil from oil chamber 54 to air heater 28 through oil line 34. By reason of this arrangement, the walls of coating chamber 14, through which optical fiber 12 travels while being coated, are thereby heated. This minimizes undesirable cooling of optical fiber 12 and also prevents condensation of the coating material on the inner walls of coating chamber 14.

An upper ring-like member 60 is welded to the upper end of chamber pipe 50. As shown, ring-like member 60 includes a lower, inwardly directed circumferential flange 62, having an inner diameter substantially identical to the inner diameter of chamber pipe 50. A cutaway shoulder 64 is formed along the inner circumference of flange 62. The upper end of chamber pipe 50 fits within shoulder 64 and is welded to ring-like member 60 thereat. Ring-like member 60 further includes a cylindrical member 66, formed integrally at the outer circumference of flange 62 and extending upwardly therefrom. It will therefore be appreciated that the diameter of cylindrical member 66 is greater than that of chamber pipe 50. Cylindrical member 66 is preferably formed with a lower circumferential shoulder 68 and an upper circumferential shoulder 70 along the inner wall thereof, the purpose for which will be made apparent from the discussion hereinafter. Lastly, ring-like member 60 includes an upper, outwardly directed circumferential flange 72 integrally formed at the upper end of cylindrical member 66.

An outer ring 74 extends outwardly from and is welded to oil jacket 52 at the upper end thereof. An outer cylindrical member 76 is welded at its lower end to the outer circumference of outer ring 74, and is welded at its upper end to the outer circumference of flange 72. In addition, outer cylindrical member 76 is formed with an opening 78, and cylindrical member 66 is formed with an opening 80 in radial and axial alignment with opening 78. A one-half inch inlet sock 82 extends through openings 78 and 80 and is welded to outer cylindrical member 76 and cylindrical member 66 thereat, for supplying the coating material to coating chamber 14. Outer cylindrical member 76 is formed with a further opening 84 at which oil outlet pipe 58, which may have a diameter of ⅜ inch, is welded. It will be appreciated that cylindrical member 66, flange 72, outer ring 74, outer cylindrical member 76, and the outer wall of inlet sock 82 define the upper end of oil chamber 54 which is in fluid communication with the lower end of chamber 54 defined between chamber pipe 50 and oil jacket 52. Thus, because heated oil surrounds the vaporized coating material within coating chamber 14, the inner walls of chamber pipe 50 and cylindrical member 66 are heated, thereby preventing condensation of the coating material of the inner walls of coating chamber 14, and minimizing cooling of optical fiber 12 as it travels through coating chamber 14.

A cylindrical flow controlling member 86, shown in FIGS. 2 and 3, includes a cylindrical member 87 having the same inner diameter as chamber pipe 50. Flow controlling member 86 seats on lower circumferential shoulder 68 and fits within cylindrical member 66 of ring-like member 60, such that the lower end of cylindrical member 87 is spaced from flange 62 by a narrow gap, for example, of approximately 2 mm. A chamber 88 is therefore formed between cylindrical members 66 and 87. Chamber 88 is in fluid communication with inlet sock 82 supplied with the coating material, which is in vapor form. is integrally formed as part of flow controlling member 86 on cylindrical member 87 at a position below opening 80 when flow controlling member 86 is in assembled position. Flange 90 sits upon shoulder 68 in sealing contact therewith to support flow controlling member 86 in its assembled position, such that the aforementioned gap of approximately 2 mm is set. As shown, a plurality of flow orifices 92 are provided in flange 90 to permit the coating material in vapor form to pass from chamber 88. Twelve orifices 92 are preferably provided, each having a diameter of approximately 2 mm.

A lower, outwardly directed circumferential flange 94 is integrally formed as part of flow controlling member 86 on the lower end of cylindrical member 87. Flange 94 has an outer diameter less than the inner diameter of cylindrical member 66 and is spaced therefrom to form a flow directing gap 96 of, for example, approximately 1 mm. Further, the lower surface of flange 94 is in the same plane as the lower edge of cylindrical member 87. Accordingly, a circumferential passage or slit 98 of approximately 2 mm is formed between flanges 62 and 94, passage 98 being in fluid communication with the interior of coating chamber 14 through which optical fiber 12 travels. Passage 98 is formed at a distance of approximately one pipe diameter from the top of coating chamber 14. The coating material in vapor form impinges on optical fiber 12 through passage 98. It will be appreciated, however, that flanges 62 and 94 which define passage 98, may be inclined so that the coating material impinges at an angle on optical fiber 12.

An annular securing member 100, having the same inner diameter as flow controlling member 86, has an inner circumferential shoulder 102 at its lower end which sits on the upper edge of cylindrical member 87 and is welded thereat. The lower, outer circumferential edge of annular securing member 100 sits on shoulder 70 of cylindrical member 66.

Thus, the coating material supplied through inlet sock 82 travels through annular chamber 88, through orifices 92, within gap 96, and through passage 98 into the interior of coating chamber 14 through which optical fiber 12 travels. In effect, orifices 92 and gap 96 function to define flow restriction means by which uniform coating at low flow rates and no turbulence is achieved. Thus, because of the orifices 92 and the tortuous path through gap 96 and passage 98, the jet action and turbulence of the prior art is eliminated. More importantly, there is no disturbance of optical fiber 12 by the coating material, and there results a uniform coating of optical fiber 12 at low flow rates.

As shown in FIG. 2, annular securing member 100 includes a plurality of threaded bores 104 in the upper surface thereof, which allow unscrewing this part for cleaning purposes. A closure plate 106, having a central slit 108 through which optical fiber 12 passes, is put on the upper end of annular securing member 100, to minimize undesirable air entrance.

Assuming optical fiber 12 has a diameter of approximately 0.13 mm, central opening 108 has a slightly larger width. The bottom portion (not shown in detail) of coating chamber 14 has the same structural configuration as the top portion shown in detail in FIG. 2. However, the twelve orifices 92 formed in the bottom portion have a diameter of 3 mm, rather than 2 mm, in order to allow for an exhaust gas volume of three to five times the gas feed rate. This permits the coating material which enters at the top portion to exit coating chamber 14 at the bottom thereof without hindering the inflow of new coating material. The coating material exits coating chamber 14 at the bottom thereof through an outlet 112, which is complementary to inlet 82. The spent coating material is therefore supplied from outlet 112, through an exit line 114 to an exhaust fan 116 or the like. In like manner, inlet 56 is complementary to outlet 58.

The amount of time needed to coat an optical fiber 12 with the above apparatus 10 according to the present invention, is dependent on the cooling rate of the fiber. For example, assuming that the temperature of the fiber reduces from 650 degrees Centigrade at the bottom portion of coating chamber 14 down to 400 degrees Centigrade at the top portion thereof, and for an optical fiber having a diameter of 0.125 mm, the heat content associated with the temperature drop is approximately 6.4 J, the radiation loss is approximately 8 J/sec. and the convection loss is approximately 2.3 J/sec. Thus, the available coating time equals 6.4/(8+2.3) or 0.6 second.

If coating chamber 14 has a length of 0.6 mm, the optical fiber 12 at the chamber entrance has a temperature of 650 degrees Centigrade and the optical fiber 12 is moving at a speed of 1 m/sec., optical fiber 12 will be cooled to approximately 400 degrees Centigrade and have a film thickness of approximately 100 nm applied thereto.

Having described a specific preferred embodiment of the invention with reference to the accompanying drawings, it will be appreciated that the present invention is not limited to that precise embodiment and that various changes and modifications can be effected therein by one of ordinary skill in the art without departing from the scope or spirit of the invention as defined by the appended claims.

| GLOSSARY | |
|---|---|
| Reference Number | Description |
| 10 | apparatus |
| 12 | optical fiber |
| 14 | coating chamber |
| 16 | coating material supply assembly |
| 18 | heating assembly |
| 20 | metering pump |
| 20a | air inlet |
| 22 | source |
| 24 | evaporator |
| 24a | inner chamber |
| 24b | outer jacket |
| 24c | first inlet |
| 24d | second inlet |
| 24e | third inlet |
| 26 | heated oil bath |
| 28 | air heater |
| 30 | pump |
| 32 | oil line |
| 34 | oil line |
| 36 | oil line |
| 38 | heating device |
| 40 | water bubble |
| 42 | copper coil |
| 44 | air line |
| 50 | chamber pipe |
| 52 | oil jacket |
| 54 | oil chamber |
| 56 | oil inlet |
| 57 | oil line |
| 58 | oil outlet pipe |
| 60 | ring-like member |
| 62 | lower, inwardly directed circumferential flange |
| 64 | cut-away shoulder |
| 66 | cylindrical member |
| 68 | lower circumferential shoulder |
| 70 | upper circumferential shoulder |
| 72 | upper, outwardly directed circumferential flange |
| 74 | outer ring |
| 76 | outer cylindrical member |
| 78 | opening |
| 80 | opening |
| 82 | inlet sock |
| 84 | opening |
| 86 | flow controlling member |
| 87 | cylindrical member |
| 88 | chamber |
| 90 | upper, outwardly directed |

| Reference Number | Description |
| --- | --- |
| | circumferential flange |
| 92 | flow orifice |
| 94 | lower, outwardly directed circumferential flange |
| 96 | flow directing gap |
| 98 | passage |
| 100 | annular securing member |
| 102 | circumferential shoulder |
| 104 | threaded bore |
| 106 | closure plate |
| 108 | central opening |
| 112 | outlet |
| 114 | exit line |
| 116 | exhaust fan |

What is claimed is:

1. A coating chamber for coating an elongated fiber with a coating material in vapor form as the fiber moves therethrough, comprising:

an inner chamber through which said fiber to be coated an inlet supplied with said coating material in vapor form;

flow restriction means in fluid communication between said inlet and said inner chamber for reducing the rate of flow of said coating material traveling from said inlet to said inner chamber, said flow restriction means including:

circumferential flange means positioned between said inlet and said inner chamber, and surrounding said fiber to be coated, for preventing flow of said coating compound from said inlet to said inner chamber, and small diameter orifice means in said circumferential flange means for providing a reduced rate of flow of said coating compound from said inlet to said inner chamber through said flange means; and circumferential passage means surrounding said fiber and defining a tortuous reduced dimension path terminating in a circumferential slit, from said flow restriction means to said inner chamber, for supplying said coating material to said fiber;

wherein said small diameter orifice means and said tortuous reduced dimension path reduce the flow rate and turbulence of said coating compound contacting said fiber to provide a uniform coating one said fiber.

2. A coating chamber according to claim 1; including a chamber pipe through which said elongated fiber moves, said chamber pipe having an upper end; a ring-like member secured to the upper end of said chamber pipe; and flow controlling means assembled within said ring-like member for defining said flow restriction means and said passage means.

3. A coating chamber according to claim 2; wherein said ring-like member includes an outwardly directed circumferential flange secured to the upper end of said chamber pipe, and said flow controlling means includes a first cylindrical member and a lower, outwardly directed circumferential flange secured to said first cylindrical member in spaced relation to said flange of said ring-like member when said flow controlling means is assembled therein to define said passage means.

4. A coating chamber according to claim 2; wherein said flange of said ring-like member has an outer circumference, and said ring-like member includes a second cylindrical member secured to the outer circumference of said flange; and said lower flange of said flow controlling means has an outer diameter less than the inner diameter of said second cylindrical member to define a gap therebetween which forms part of the tortuous path of said flow restriction means.

5. A coating chamber according to claim 4; wherein said flow controlling means includes said circumferential flange means in the form of an upper, outwardly directed circumferential flange in sealing contact with said second cylindrical member, said upper flange including said small diameter orifice means in the form of a plurality of orifices spaced circumferentially thereabout, whereby said coating material in vapor form is supplied from said inlet, through said orifices, through said gap and through said passage means for coating said elongated fiber.

6. A coating chamber according to claim 5; wherein said first and second cylindrical members define a circumferential chamber in fluid communication between said inlet and said plurality of orifices.

7. A coating chamber according to claim 2; wherein said flow controlling means includes said circumferential flange means in the form of a circumferential flange in sealing contact with said ring-like member, said circumferential flange including said small diameter orifice means in the form of a plurality of orifices in fluid communication between said inlet and said passage means.

8. A coating chamber according to claim 2; further including heating means in surrounding relation to said chamber pipe and said ring-like member for preventing condensation of said coating material in said coating chamber and for minimizing cooling of said fiber.

9. A coating chamber according to claim 8; wherein said heating means includes a jacket surrounding said chamber pipe and said ring-like member for containing a heated fluid.

10. A coating chamber according to claim 1; wherein said elongated fiber is an optical fiber.

11. Apparatus for coating an elongated fiber with a coating material in vapor form, comprising:

(a) a coating chamber through which said fiber moves, said coating chamber including:

(1) an inner chamber through which said fiber to be coated travels, (2) an inlet supplied with said coating material in vapor form;

(3) flow restriction means in fluid communication between said inlet and said inner chamber for reducing the rate of flow of said coating material traveling from said inlet to said inner chamber, said flow restriction means including:

(i) circumferential flange means positioned between said inlet and said inner chamber, and surrounding said fiber to be coated, for preventing flow of said coating compound from said inlet to said inner chamber, and (ii) small diameter orifice means in said circumferential flange means for providing a reduced rate of flow of said coating compound from said inlet to said inner chamber through said flange means; and (4) circumferential passage means surrounding said fiber and defining a tortuous reduced dimension path terminating in a circumferential slit, from said flow restriction means to said inner chamber, for supplying said coating material to said fiber, wherein said small diameter orifice means and said tortuous reduced dimension path reduce the flow rate and turbulence of said coating compound contacting said fiber; and (b) means for supplying said coating material in vapor form to said inlet.

12. Apparatus according to claim 11; wherein said coating chamber includes a chamber pipe through which said elongated fiber moves, said chamber pipe having an upper end; a ring-like member secured to the upper end of said chamber pipe; and flow controlling means assembled within said ring-like member for defining said flow restriction means and said passage means.

13. Apparatus according to claim 12; wherein said ring-like member includes an outwardly directed circumferential flange secured to the upper end of said chamber pipe, and said flow controlling means includes a first cylindrical member and a lower, outwardly directed circumferential flange secured to said first cylindrical member in spaced relation to said flange of said ring-like member when said flow controlling means is assembled therein to define said passage means.

14. Apparatus according to claim 12; wherein said flange of said ring-like member has an outer circumference, and said ring-like member includes a second cylindrical member secured to the outer circumference of said flange; and said lower flag of said flow controlling means has an outer diameter less than the inner diameter of said second cylindrical member to define a gap therebetween which forms part of the tortuous path of said flow restriction means.

15. Apparatus according to claim 14; wherein said flow controlling means includes said circumferential flange means in the form of an upper, outwardly directed circumferential flange in sealing contact with said second cylindrical member, said upper flange including said small diameter orifice means in the form of a plurality of orifices spaced circumferentially thereabout, whereby said coating material in vapor form is supplied from said inlet, through said orifices, through said gap and through said passage means for coating said elongated fiber.

16. Apparatus according to claim 15; wherein said first and second cylindrical members define a circumferential chamber in fluid communication between said inlet and said plurality of orifices.

17. Apparatus according to claim 12; wherein said flow controlling means includes said circumferential flange means in the form of a circumferential flange in sealing contact with said ring-like member, said circumferential flange including said small diameter orifice means in the form of a plurality of orifices in fluid communication between said inlet and said passage means.

18. Apparatus according to claim 12; wherein said coating chamber further includes heating means in surrounding relation to said chamber pipe and said ring-like member for preventing condensation of said coating material in said coating chamber and for minimizing cooling of said fiber.

19. Apparatus according to claim 18; wherein said heating means includes a jacket surrounding said chamber pipe and said ring-like member for containing a heated fluid.

20. Apparatus according to claim 11; wherein said elongated fiber is an optical fiber.

21. Apparatus according to claim 11; wherein said means for supplying said coating material includes an evaporator, sid evaporator including an inner chamber supplied with said coating material, and jacket means surrounding said inner chamber and supplied with a heated fluid for heating said coating material in said inner chamber.

22. Apparatus according to claim 21; wherein said coating chamber includes a chamber pipe through which said elongated fiber moves, said chamber pipe having an upper end, a ring-like member secured to the upper end of said chamber pipe, flow controlling means assembled within said ring-like means for defining said flow restriction means and said passage means, and heating means in surrounding relation to said chamber pipe and said ring-like member for preventing condensation of said coating material in said coating chamber and for minimizing cooling of said fiber, said heating means including jacket means surrounding said chamber pipe and said ring-like member for containing a heated fluid, and said heated fluid from said jacket means of said evaporator is supplied as said heated fluid to the jacket means of said heating means.

23. Apparatus according to claim 21; further comprising means for supplying a heated gas to said inner chamber of said evaporator for entraining said coating fluid in vapor form.

24. Apparatus according to claim 23; wherein said means for supplying a heated gas includes a heated fluid bath, coil means for transporting said gas through said heated fluid bath to heat said gas in fluid exchanging relation, and tubing means for supplying said heated gas to said inner chamber of said evaporator.

25. Apparatus according to claim 23; wherein said means for supplying a heated gas includes humidifier means for humidifying said gas prior to heating the same.

26. A coating chamber for coating an elongated hot fiber with a coating material in vapor form as the fiber moves therethrough, comprising:

a vertically situated coating chamber including an upper end, a vapor inlet and a cylindrical pipe;

a circumferential slit inside the coating chamber and displaced from the upper end of the coating chamber by approximately the diameter of said pipe;

a circumferential flange positioned between the vapor inlet and the slit, for preventing flow of the coating compound from the vapor inlet to the slit;

at least one narrow opening in the flange between said vapor inlet and said circumferential slit, said at least one narrow opening causing a flow resistance for the coating material in vapor form such that a very uniform flow pattern is achieved, contacting the fiber with substantially identical low vapor speeds from all sides, thereby minimizing intermixing of coating vapors and outside air;

a tortuous path provided between said flange and said slit; and a heating jacket for heating the wall of the chamber to a temperature well above the condensation point of the coating material in vapor form and below the decomposition temperature of the coating material in vapor form, wherein said at least one narrow opening, said tortuous path and said slit reduce the flow rate and turbulence of said coating compound contacting the fiber.

27. A coating chamber according to claim 26; wherein said heating jacket uses hot oil for heating the wall of the chamber.

28. A coating chamber for coating an elongated hot fiber with a coating material in vapor form as the fiber moves therethrough, comprising:
 a vertically situated coating chamber including an upper end, a vapor inlet, a vapor outlet and a cylindrical pipe; p1 a circumferential slit inside the coating chamber and displaced from the lower end of the coating chamber by approximately the diameter of said pipe;
 a circumferential flange positioned between the vapor inlet and the slit, for preventing flow of the coating compound from the vapor inlet to the slit;
 at least one narrow opening in the flange between said vapor inlet and said circumferential slit;
 a tortuous path provided between said flange and said slit; and
 wherein exhaust vapors are taken from all sides at the lower end of the coating chamber, thereby avoiding disturbance of the fiber to be coated and minimizing intermixture of coating material in vapor with outside air.

* * * * *